United States Patent
Nakanishi et al.

(10) Patent No.: US 6,573,685 B2
(45) Date of Patent: Jun. 3, 2003

(54) METHOD OF REPLACING SECONDARY BATTERY

(75) Inventors: Toshiaki Nakanishi, Aichi (JP); Hiromichi Kuno, Aichi (JP); Tadao Kimura, Hyogo (JP); Yozoh Ogino, Aichi (JP); Sadao Mizuno, Aichi (JP); Kouji Otsubo, Aichi (JP); Masayoshi Iwase, Aichi (JP); Yoshiyuki Nakayama, Aichi (JP); Toshiyuki Sekimori, Aichi (JP); Kazuo Tojima, Aichi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 9 days.

(21) Appl. No.: 09/839,473

(22) Filed: Apr. 20, 2001

(65) Prior Publication Data

US 2001/0035737 A1 Nov. 1, 2001

(30) Foreign Application Priority Data

Apr. 28, 2000 (JP) .................................... 2000-131754
Aug. 7, 2000 (JP) .................................... 2000-238749

(51) Int. Cl.$^7$ .................................................. H02J 7/00
(52) U.S. Cl. ........................................................ 320/122
(58) Field of Search ................................ 320/120, 122, 320/150, 116

(56) References Cited

U.S. PATENT DOCUMENTS 5,744,936 A * 4/1998 Kawakami .................. 320/122
5,886,527 A    3/1999 Ito ............................. 324/431
6,037,095 A * 3/2000 Miyasaka ................. 429/218.1
6,137,261 A * 10/2000 Kurle et al. ................. 320/150
6,297,616 B1 * 10/2001 Kubo et al. ................. 320/116

FOREIGN PATENT DOCUMENTS

| EP | 609 101 | 8/1994 |
| JP | 2-101937 | 4/1990 |
| JP | 4-341769 | 11/1992 |
| JP | 8-203567 | 8/1996 |
| JP | WO 97-27495 | 7/1997 |
| JP | 10-2943 | 1/1998 |
| JP | 11-89101 | 3/1999 |
| JP | 2000-12098 | 1/2000 |

OTHER PUBLICATIONS

European Search Report.

* cited by examiner

*Primary Examiner*—Edward H. Tso
*Assistant Examiner*—Pia Tibbits
(74) *Attorney, Agent, or Firm*—Merchant & Gould P.C.

(57) ABSTRACT

The present invention provides a method of replacing secondary batteries. In the method, batteries can be replaced at a low cost and performance of an overall battery assembly can be maximized after the battery replacement. The battery assembly is composed by electrically connecting a plurality of secondary batteries in series or in parallel. When a portion of the secondary batteries is judged as defective, the defective batteries are replaced by replacement batteries. In an aspect of the method, voltage is detected for every predetermined voltage detection block unit concerning secondary batteries composing the battery assembly in order to judge defects of the secondary batteries in the voltage detection block unit. Batteries in a voltage detection block unit will be replaced with replacement batteries if they are judged as defective.

12 Claims, 7 Drawing Sheets

METHOD OF REPLACING SECONDARY BATTERY

BACKGROUND OF THE INVENTION

1. Field of the Invention

The present invention relates to a method of replacing a portion of the secondary batteries of a battery assembly composed of plural secondary batteries electrically connected in series or in parallel, when some of the secondary batteries are degraded, aged or failed. The present invention especially relates to a method of replacing secondary batteries that are provided in pure electric vehicles (PEV) and hybrid electric vehicles (HEV).

2. Description of the Related Art

Secondary batteries include lead-acid batteries, nickel-cadmium (Ni—Cd) batteries, nickel-metal hydride (Ni—MH) batteries, lithium ion batteries or the like. After consuming their power, these batteries can be charged by connecting with an external power source and supplying a predetermined current. Because of such characteristics, these batteries have been used in various apparatuses. For example, batteries have been equipped in vehicles to supply power to spark plugs of engines.

Recently, Ni—MH batteries are used predominantly due to their high energy density (i.e., energy can be accumulated in a small space) and their high output density to be used as main power sources for driving electric motors in pure electric vehicles (PEV) and/or so-called hybrid electric vehicles (HEV) having both engines and electric motors. In such PEV and HEV, a plurality of cells are assembled in series or in parallel to construct one battery assembly to be used for a battery pack, so that sufficient power can be supplied to motors.

A Ni—MH battery formed as an assembly of a plurality of batteries is provided in a PEV or HEV. The battery can be used for a long time under an appropriate operating condition. Generally however, an individual cell of a battery assembly will be out of order or reach the end of its lifetime due to differences between the secondary batteries or failures of parts composing the secondary batteries. The battery assembly cannot function sufficiently even if one secondary battery of the battery assembly is out of order or at the end of its lifetime, and this can result in malfunction of the system. Therefore, a number of methods of detecting abnormality, failures or degradation of secondary batteries have been proposed.

Well-known methods include, for example, a degradation judgment based on a decline of output voltage of a battery, or a degradation judgment based on the specific gravity of an electrolytic solution for a case of a lead-acid battery. JP-A-4-341769 describes a judgment based on a change of voltage-current characteristics caused by a rise of internal resistance of a battery. JP-A-11-89101 describes memorizing battery operation time and judging degradation when the time reaches a predetermined level. In WO 97-27495, degradation is judged by using a temperature rise of a battery.

Conventional techniques concerning replacement of an overall battery assembly are applied to batteries of portable phones, notebook personal computers, video cameras, or the like. A conventional technique concerning partial replacement of a battery assembly is disclosed in JP-A-8-203567. In this description, a terminal voltage at every lead-storage battery composing a battery assembly is observed. When the voltage becomes equal to or lower than a predetermined voltage value, the state is judged as degradation, and a voltage drop display LED lights up.

JP-A-2-101937 describes an example of using a Ni—Cd storage battery for a secondary battery. In this description, respective output voltages of a plurality of battery cells are detected sequentially by a voltage detection means. Battery cells having detected output voltages of not more than a standard value are identified and displayed by a displaying means to report the necessity of battery replacement.

However, the above-mentioned conventional techniques concerning partial replacement of a battery assembly do not refer to differences in characteristics between newly added secondary batteries and used batteries of the battery assembly.

In a lead-acid battery, a variation in a state-of-charge (SOC) in the respective batteries after replacement is cancelled by carrying out a constant voltage charge, and the overall battery assembly can be fully charged. However, a Ni—MH battery or Ni—Cd battery may be overcharged in a constant voltage charge. As a result, the SOC variation between the replacement battery and the initial battery assembly cannot be cancelled, and the batteries cannot deliver the maximum performance.

When a replacement battery has a capacity smaller than an average capacity of the battery assembly, the performance of the original battery assembly cannot be maintained in an intended use where the capacity of the battery assembly is important.

When being applied to a HEV or the like, a secondary battery will be used constantly with the state-of-charge in an intermediate area without being fully charged. In such a case, the following problems can occur. First, a variation in the state-of-charge of the batteries causes a restriction on the discharge side with a battery having a small state-of-charge while the charge side is restricted by a battery having a large state-of-charge. This makes it impossible to make the most use of the battery capacity. Second, a variation in the self-discharge characteristics of the batteries causes a restriction on the discharge side with a battery having a large self-discharge while the charge side is restricted with a battery having small self-discharge. This will cause a variation of the state-of-charge. Third, a variation of the internal resistance of the batteries can hinder sufficient performance of the batteries, since a combination of a replacement battery having a large internal resistance with a battery assembly can cause an error to an actual capacity depending on capacity judgments.

SUMMARY OF THE INVENTION

The present invention is made to solve the above-mentioned problems, and has an object of providing a method of replacing secondary batteries at a low cost to provide an overall battery assembly with a maximum performance after the replacement.

Also the present invention provides a method of replacing secondary batteries in which battery characteristics are used as a further standard to judge defective batteries, and a recoverable secondary battery is reused. Accordingly, a cost of replacement batteries is lowered and wastes can be reduced remarkably.

For the above-mentioned purposes, the present invention provides a method of replacing secondary batteries, and the method comprises the steps of:

preparing a battery assembly of a plurality of secondary batteries electrically connected in series or in parallel;

and replacing a portion of the plurality of batteries with one or more replacement batteries when the portion is judged as defective as a result of a detection. In the method, voltage is detected for every voltage detection block in order to judge defects of secondary batteries in the voltage detection block unit. Batteries to be replaced, that is, batteries judged as defective, are replaced with replacement batteries in the voltage detection block unit.

According to the method, overall replacement of the battery assembly is not required. Also, there is no need to specify which of the all secondary batteries composing the battery assembly is defective. Since replacement is carried out in a voltage detection block unit to detect and control battery voltage in a conventional construction, detection of defective batteries can be performed only by modifying software without adding any hardware. As a result, the cost of the replacement battery itself and also cost concerning detection of defective batteries can be reduced.

Preferably in the replacing method, a secondary battery having a maximum capacity ranking among a battery group composing the assembly is used for the replacement battery.

Accordingly, the capacity of the battery assembly will not be restricted by the replacement battery, so that the performance of the original battery assembly can be maintained.

It is preferable that when a defect of a battery is detected, secondary batteries positioned in the vicinity of the defective battery to compose a battery assembly also are replaced by replacement batteries. Preferably, an ambient temperature of the batteries to be replaced is detected to determine whether the secondary batteries positioned in the vicinity of the defective battery should be replaced or not.

Accordingly, batteries positioned in the vicinity of a defective battery are replaced before any failure occurs in the battery assembly in the case wherein the temperature is raised locally in the vicinity of the defective batteries or wherein batteries around the defective battery are subjected to a high temperature due to heating of the defective battery itself. In this way, any possible failures of the batteries can be prevented.

Preferably, activated secondary batteries are used for the replacement batteries. As a means to activate secondary batteries, cyclic charge-discharge is preferred. It is particularly preferred to carry out cyclic charge-discharge until the sum of charge-discharge power in the charge-discharge cycle becomes at least 450% of the battery capacity.

FIG. 5 shows a relationship between a mileage of a vehicle and an internal resistance of a battery assembly equipped in the vehicle. As shown in FIG. 5, the internal resistance of the battery assembly is lowered in an initial step of driving, and later it is maintained substantially constant. And the internal resistance is increased at the end of the lifetime of the battery assembly.

FIG. 6 shows a change in a battery internal resistance when a cyclic charge-discharge is carried out for the replacement batteries. In FIG. 6, the initial value is set to be '1'. As shown in this drawing, the battery internal resistance fluctuates considerably in the initial state. By performing charge-discharge of approximately 450% or more of the battery capacity, an internal resistance of about 70% to that in the initial state will be obtainable. Therefore, when a cyclic charge-discharge is carried out until the sum of the charge-discharge amount during the cycle is 450% or more of the battery capacity, a difference in the internal resistance between the replacement battery and the other batteries can be corrected even if the internal resistance of the other batteries has changed by the time that the replacement battery is combined in the battery assembly.

Another preferred method to activate a replacement secondary battery is to leave the battery for at least five days while keeping the battery temperature at 50° C. or more. By leaving the battery at a temperature of at least 50° C. for at least five days, an oxide film on the surface of the activated material inside the battery can be removed efficiently. Accordingly, the internal resistance can be lowered in comparatively cost-effective equipment without conducting a cyclic charge-discharge. When a battery activated by the above means is combined in a battery assembly, a difference between the battery and the other batteries can be corrected, and the battery assembly can deliver sufficient performance.

Preferably, a replacement battery is stored at low temperatures for the above-mentioned purposes.

FIG. 7 shows a state-of-charge versus storage days for a replacement battery by using the temperature as a parameter. As shown in FIG. 7, when stored at high temperatures, the state-of-charge of a battery decreases due to a large self-discharge amount, so the battery cannot be combined immediately in the battery assembly. When the replacement battery is stored at low temperatures, decrease of the state-of-charge due to the self-discharge battery within the battery is controlled. Preferably, the temperatures are not more than 15° C., and more preferably, the temperature range is from 0 to 10° C. This can prevent battery failures caused by overdischarge when the replacement battery is combined in the battery assembly.

Preferably, a battery assembly is charged to be at least 100% of the battery capacity at a rate of 0.3 C. at most after the replacement of a portion of the secondary batteries in preparation for a subsequent use, since it is possible to cancel a variation in the state-of-charge of the battery assembly and to restrain a significant rise of the battery temperature.

Accordingly, a state-of-charge of the overall battery assembly can be equalized by overcharging the battery assembly including a replacement battery at a low rate in order to cancel differences between the replacement battery and the battery assembly. Furthermore, even when the replaced battery has been left for a long time before the replacement and the internal resistance is increased temporarily, the internal resistance can be recovered to the initial level by the overcharge.

Preferably in the replacement method, defects of the secondary batteries are determined based on a variation range in the charge amount of the battery to be replaced and also a variation range in the self-discharge amount after leaving the batteries for a predetermined period of time.

Accordingly, batteries to be replaced are not disposed of but reused after being treated in a certain manner, when the variation range in the charge amount of the batteries to be replaced is e.g., 2.0 Ah or less, and the variation in the self-discharge amount of the batteries after being left for a predetermined period, e.g., from several weeks to two months, is e.g., 0.5 Ah or less. In this method, a battery to be replaced will not necessarily be replaced by a new battery. Recycling in a material level is available, and this can lower the cost of replacement batteries, and also reduce wastes considerably.

DETAILED DESCRIPTION OF THE INVENTION

A preferred embodiment of the present invention will be described below with reference to the drawings.

Figure 1:
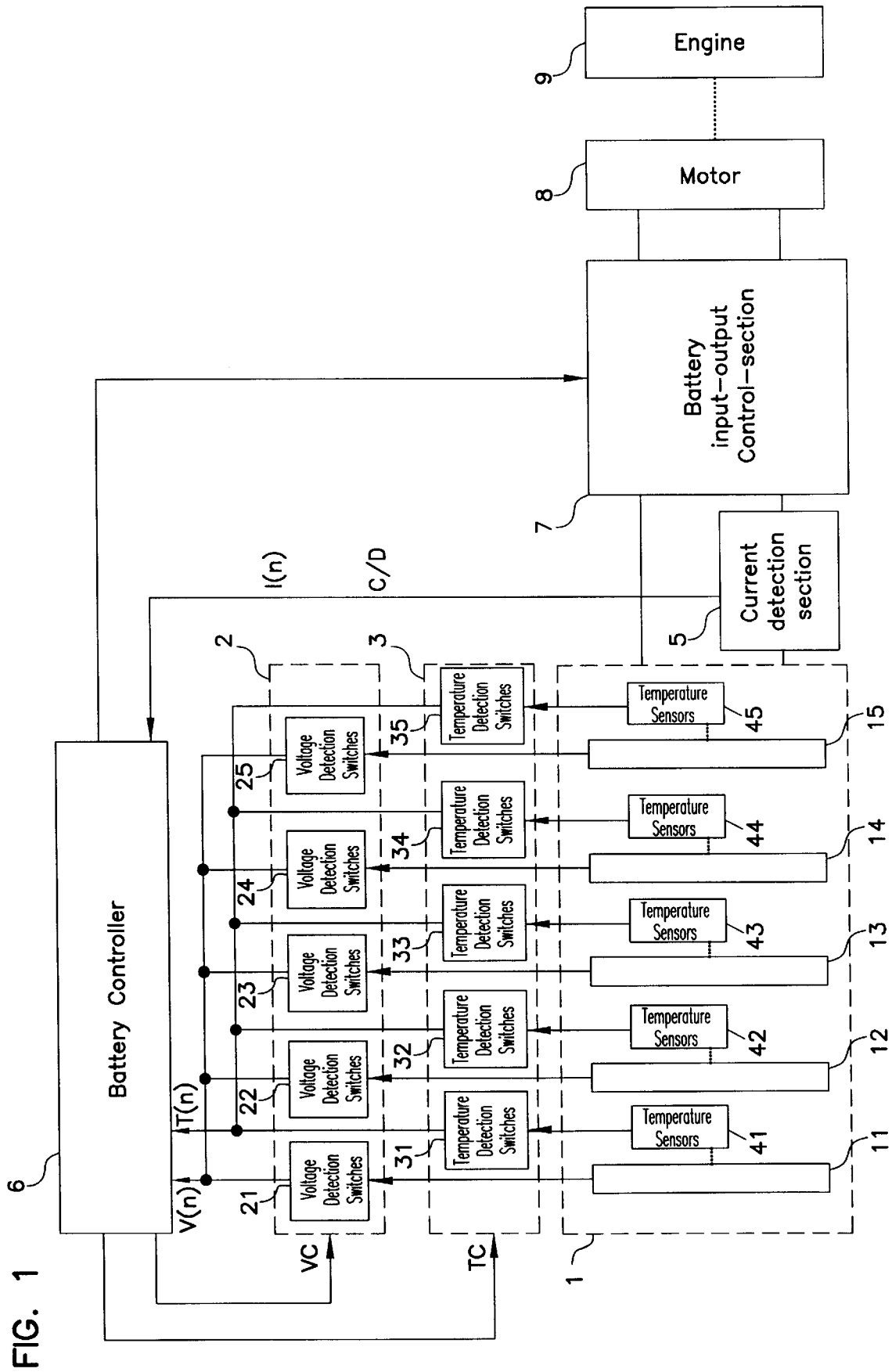
FIG. 1 is a block diagram to show a structure of a battery pack system to which a method of replacing secondary batteries in one embodiment of the present invention is applied.

FIG. 1 is a block diagram to show a battery pack system to which a method of replacing secondary batteries according to one embodiment of the invention is applicable.

In FIG. 1, numeral 1 denotes a battery pack to be provided in a hybrid electric vehicle or the like, and it is composed of secondary batteries, such as nickel-metal hydride batteries. Generally, this battery pack 1 is composed by electrically connecting a first battery module 11, a second battery module 12, a third battery module 13, a fourth battery module 14 and a fifth battery module 15 in series in order to provide a predetermined output for a motor 8. Each battery module is a nickel-metal hydride battery composed of a plurality of cells electrically connected in series. As mentioned later, the respective battery modules 11, 12, 13, 14, and 15 are separated and evaluated by a unit to detect battery voltage.

Numeral 2 denotes a voltage detection switch for the battery pack 1, and it is composed of switches 21, 22, 23, 24 and 25 to detect the respective battery voltages of the first to the fifth battery modules 11, 12, 13, 14 and 15 as voltage samples V1(n), V2(n), V3(n), V4(n) and V5(n) at a predetermined period of time in chronological order.

Numeral 3 denotes a temperature detection switch for the battery pack 1, and it is composed of switches 31, 32, 33, 34 and 35 to detect battery temperatures as temperature samples T1(n), T2(n), T3(n), T4(n) and T5(n) at a predetermined period of time in chronological order. These battery temperatures are measured at temperature sensors 41, 42, 43, 44 and 45 respectively arranged to be temperature-coupled with the first to the fifth battery modules 11, 12, 13, 14 and 15.

Numeral 5 denotes a current detection section. This is arranged between a minus output terminal of the battery pack 1 and a minus input terminal of the motor 8. The current detection section 5 samples a charge-discharge current of the battery pack 1 outputted from a current sensor (not shown) at a predetermined period of time in order to detect the current level by attaining a current sample I(n) as well as to use the sign for detecting a charge-discharge direction C/D that shows to be charged or discharged.

Numeral 6 denotes a battery controller, and this calculates a state-of-charge of the battery pack 1 based on the voltage samples, the temperature samples, and the current sample. The voltage samples V1(n), V2(n), V3(n), V4(n) and V5(n) are obtained by turning on the voltage detection switches 21, 22, 23, 24 and 25 according to a control signal VC in chronological order. The temperature samples T1(n), T2(n), T3(n), T4(n) and T5(n) are obtained by turning on the temperature detection switches 31, 32, 33, 34 and 35 according to a control signal TC in chronological order. The current sample I(n) is provided by the current detection section 5.

The battery controller 6 judges a degradation degree of the respective battery modules 11, 12, 13, 14 and 15 based on the obtained voltage samples V1(n), V2(n), V3(n), V4(n) and V5(n), and also on the obtained temperature samples T1(n), T2(n), T3(n), T4(n) and T5(n). The details will be described later.

Numeral 7 denotes a battery input-output control section. This controls a state-of-charge based on a state-of-charge level calculated by the battery controller 6 at the point of time so that the state-of-charge of the battery is within a predetermined range. Also, the battery input-output control section 7 controls the amounts of discharge and charge with respect to the battery pack 1 in order to perform power-assist and regenerating braking of an engine 9 in corresponding to a battery input-output demand from a driver, such as acceleration and deceleration operations.

Figure 2:
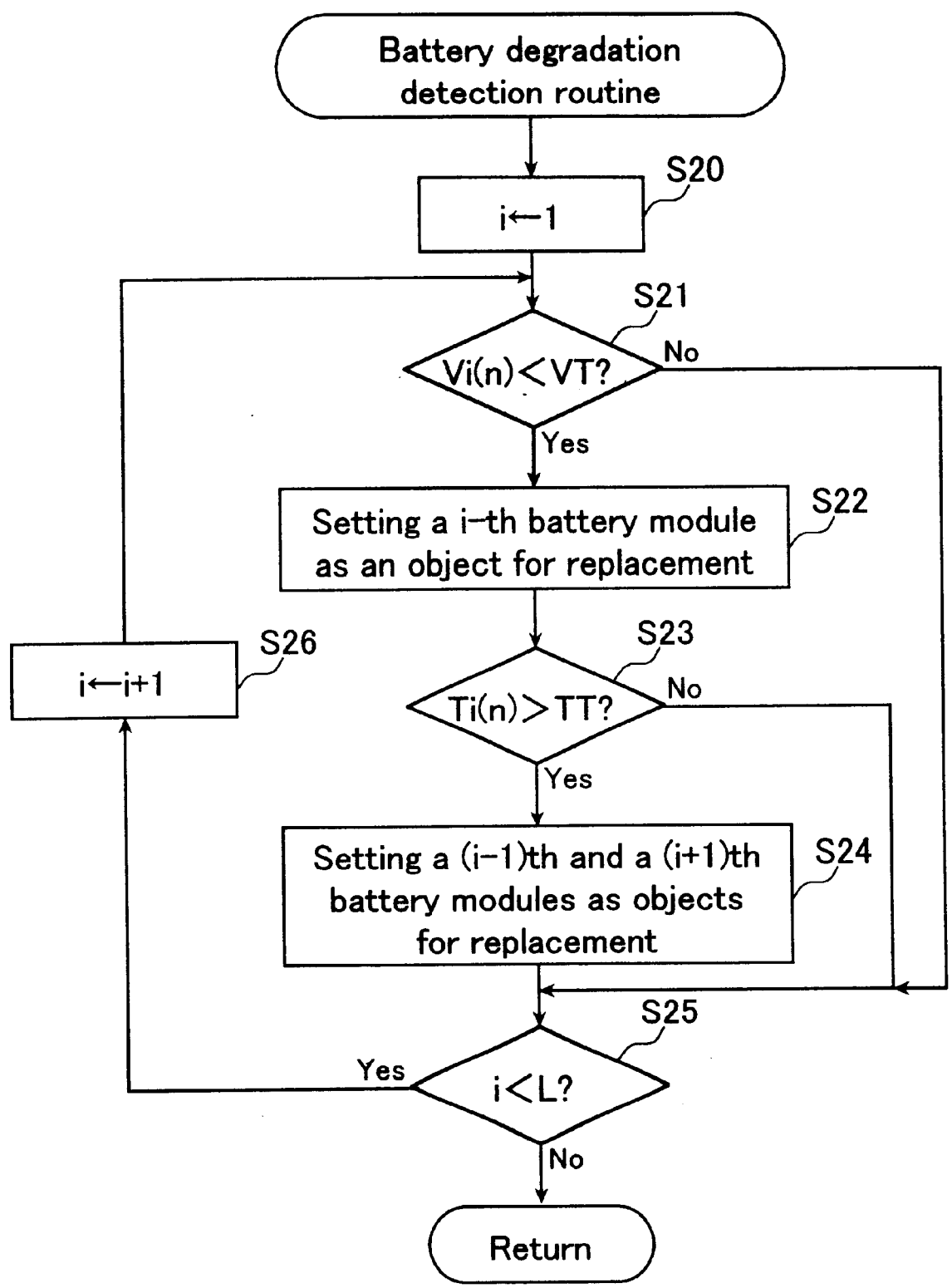
FIG. 2 is a flow chart to show a routine to detect degradation of a secondary battery in one embodiment of the present invention.
Figure 3:
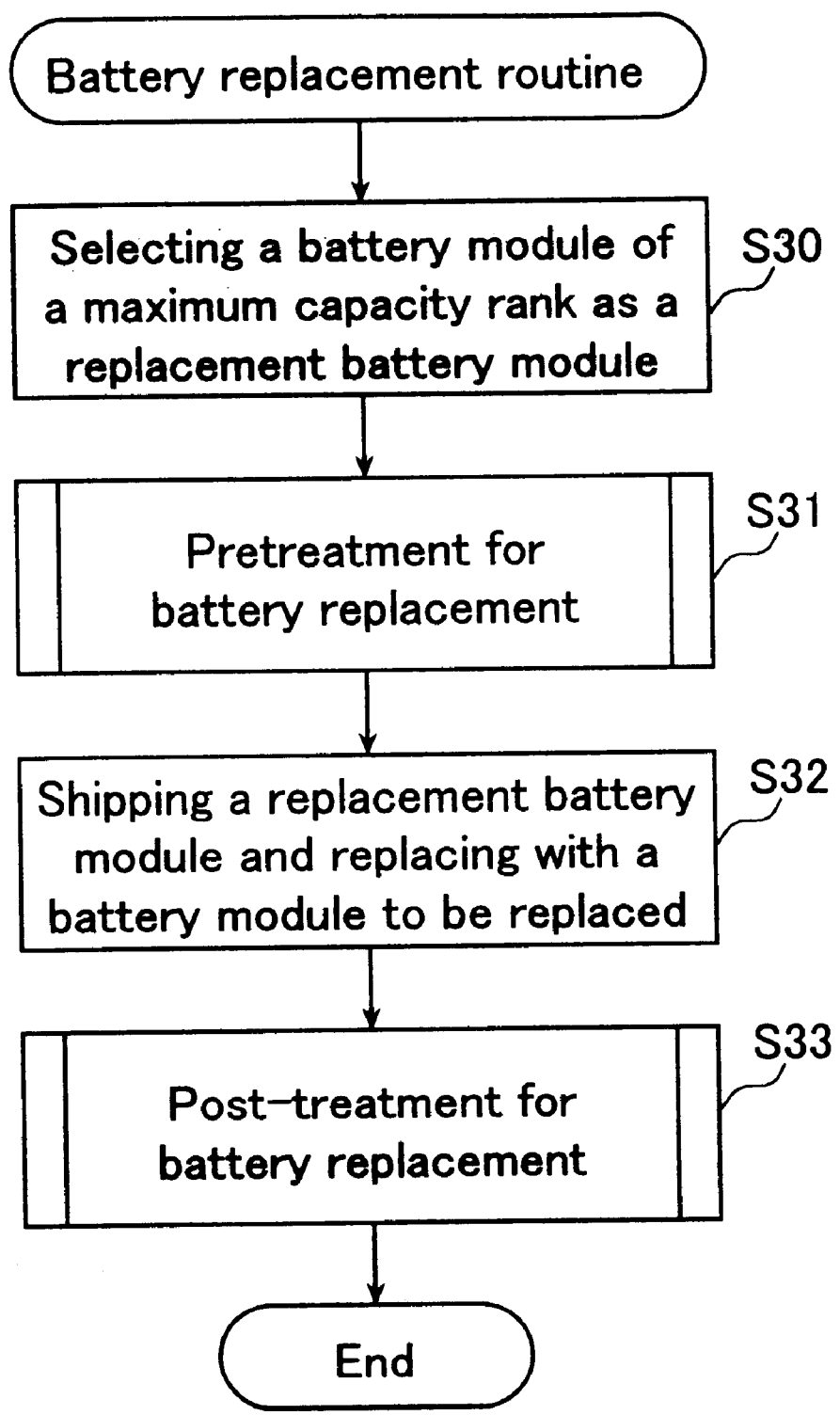
FIG. 3 is a flow chart to show a routine to replace secondary batteries in one embodiment of the present invention.

In the following, FIGS. 2 and 3 are referred to for an explanation concerning a degradation detection and replacement process of thus-configured battery pack system.

FIG. 2 is a flow chart to show a routine for detecting degradation of a secondary battery in one embodiment of the present invention.

In FIG. 2, first, a number of '1' is set as a variable 'i' representing a i-th battery module in the battery pack 1 (S20) in order to judge whether the first battery module 11 is degraded or not. Next, a voltage sample V1(n)(Vi(n), i=1), which is obtained from the first battery module 11 through the voltage detection switch 21, is judged as to whether the value is lower than a predetermined voltage threshold VT indicating battery degradation (S21). Based on the judgement result at the step S21, if V1(n) is lower than VT (Yes), degradation occurrence at the first battery module 11 is recognized. Then the first battery module 11 is set as a battery to be replaced (S22) before a subsequent step S23 starts.

When V1(n) is equal to or higher than VT (No) in the judgement at the step S21, the first battery module 11 is judged as normal, and the subsequent step S25 starts to judge degradation concerning the second battery module 12.

In the step S23, the temperature sample T1(n) (Ti(n), i=1) is judged as to whether it is higher than a predetermined temperature threshold TT. The temperature sample T1(n) (Ti(n), i=1) is obtained through a temperature detection switch 31 from a temperature sensor 41 arranged to be temperature-coupled with the first battery module 11. If T1(n) is higher than TT (Yes) as a result of judgment at the step S23, the second battery module 12 also is set as an object of replacement (S24) since degradation may occur in the future at the second battery module 12 (the (i+1)th battery module) positioned in the vicinity of the first battery module 11 because of a local temperature rise at the first battery module 11 or of heating of the first battery module 11.

If T1(n) is equal to or lower than TT (No) as a result of judgement at the step S23, it is judged that no degradation may occur in the future at the second battery module 12. In this case, the following step S25 starts to judge degradation concerning the next second battery module 12.

In the step S25, the variable 'i' is judged as to whether or not it is smaller than a battery module number L (L=5 in the example of FIG. 1). Since the variable i=1 and degradation judgement on the first battery module 11 has been completed, only the set value of the variable 'i' (i.e., '1') is incremented by 1 (S26), and the steps S21–S25 are repeated as mentioned above for the battery module 12.

When the second battery module 12 is judged as degraded in the step S21 and also judged in the step S23 that the temperature is higher than a predetermined level, the first battery module 11 and the third battery module 13 positioned in the vicinity of the second battery module 12 are also set as objects to be replaced.

In this manner, if it is judged in the step S25 that degradation judgment up to the fifth battery module 15 has been completed (No), a battery degradation detection routine is finished.

Next, FIG. 3 is used to explain a replacement process for a battery module being set as an object of replacement in steps S21 and S23 of FIG. 2.

FIG. 3 is a flow chart to show a routine to replace secondary batteries according to one embodiment of the present invention.

In FIG. 3, first, a replacement battery module is selected from among battery modules that are transported and stored at low temperatures (S30). The replacement battery module selected has a larger capacity ranking than any other battery modules, since it should have the largest capacity ranking when combined. Next, the selected replacement battery module is subjected to a pretreatment for battery replacement (S31). In this pretreatment S31, the replacement battery module is activated before shipping at least by either a cyclic charge-discharge or by leaving the battery module for at least five days in an atmosphere of a temperature of not less than 50° C. In the cyclic charge-discharge, for example, the total charge-discharge amount in the cycle is made to be at least 450% of the battery capacity. As a result of the activation, the unused replacement battery module will have a remarkable change in the self-discharge characteristics or in the initial internal resistance. Accordingly, the self-discharge characteristics and the internal resistance of the unused replacement battery module can be matched with those of the other battery modules in an operating condition.

Subsequently, the replacement battery module that has been subjected to a battery replacement pretreatment S31 is shipped for replacement into a battery module to be replaced (S32), and the overall battery pack is subjected to battery replacement post-treatment (S33). In the post-treatment S33, the battery is overcharged to at least 100% of the battery capacity, so that the state-of-charge of the replacement battery module corresponds to those of the other battery modules. In addition, the internal resistance is recovered if it is increased because of a long standing time of the replacement battery module. As a result, the overall battery pack can deliver the full performance.

Battery modules to be replaced include what has been specified as abnormal modules due to a minute short-circuit or the like, and what can be reused by recovering the battery characteristics. By rebuilding the reusable battery modules as a battery pack and shipping as a substantially new (regenerated) product, cost reduction of replacement battery pack and a remarkable reduction of waste will be available. The details are explained below.

Figure 4:
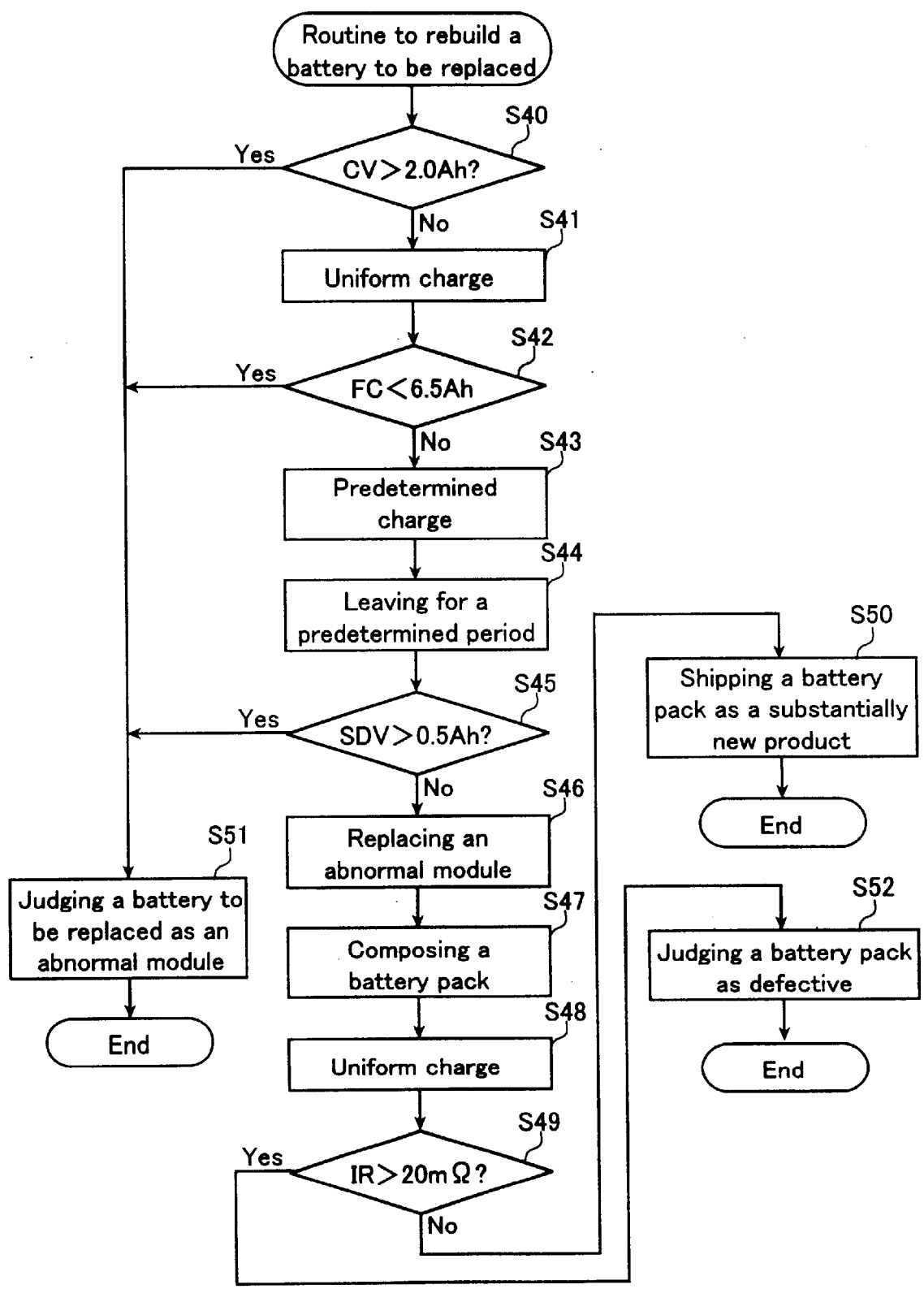
FIG. 4 is a flow chart to show a routine to rebuild a battery module to be replaced in one embodiment of the present invention.
Figure 5:
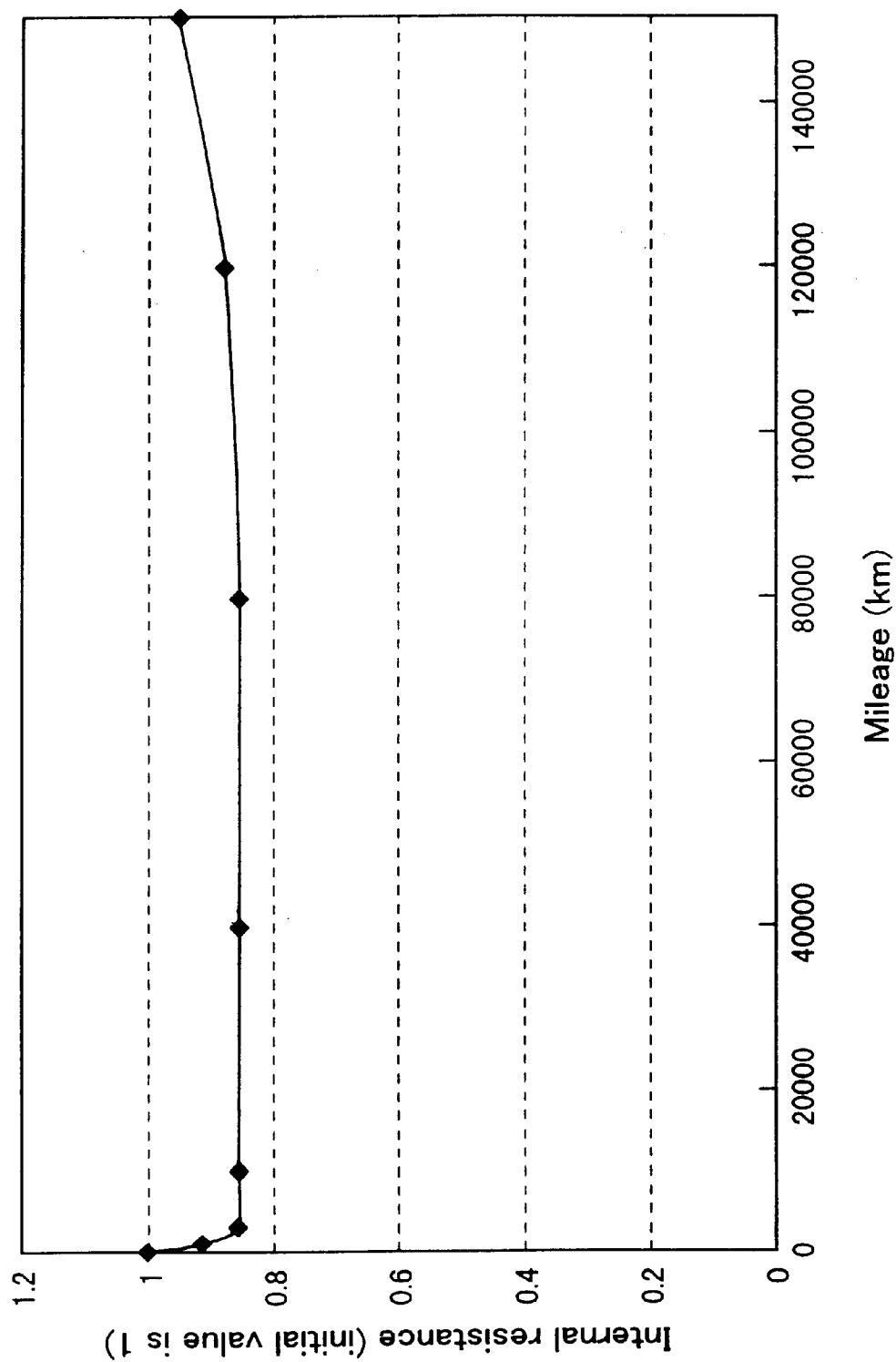
FIG. 5 is a graph to show a relationship between a mileage of a vehicle and an internal resistance of a battery assembly provided in the vehicle.
Figure 6:
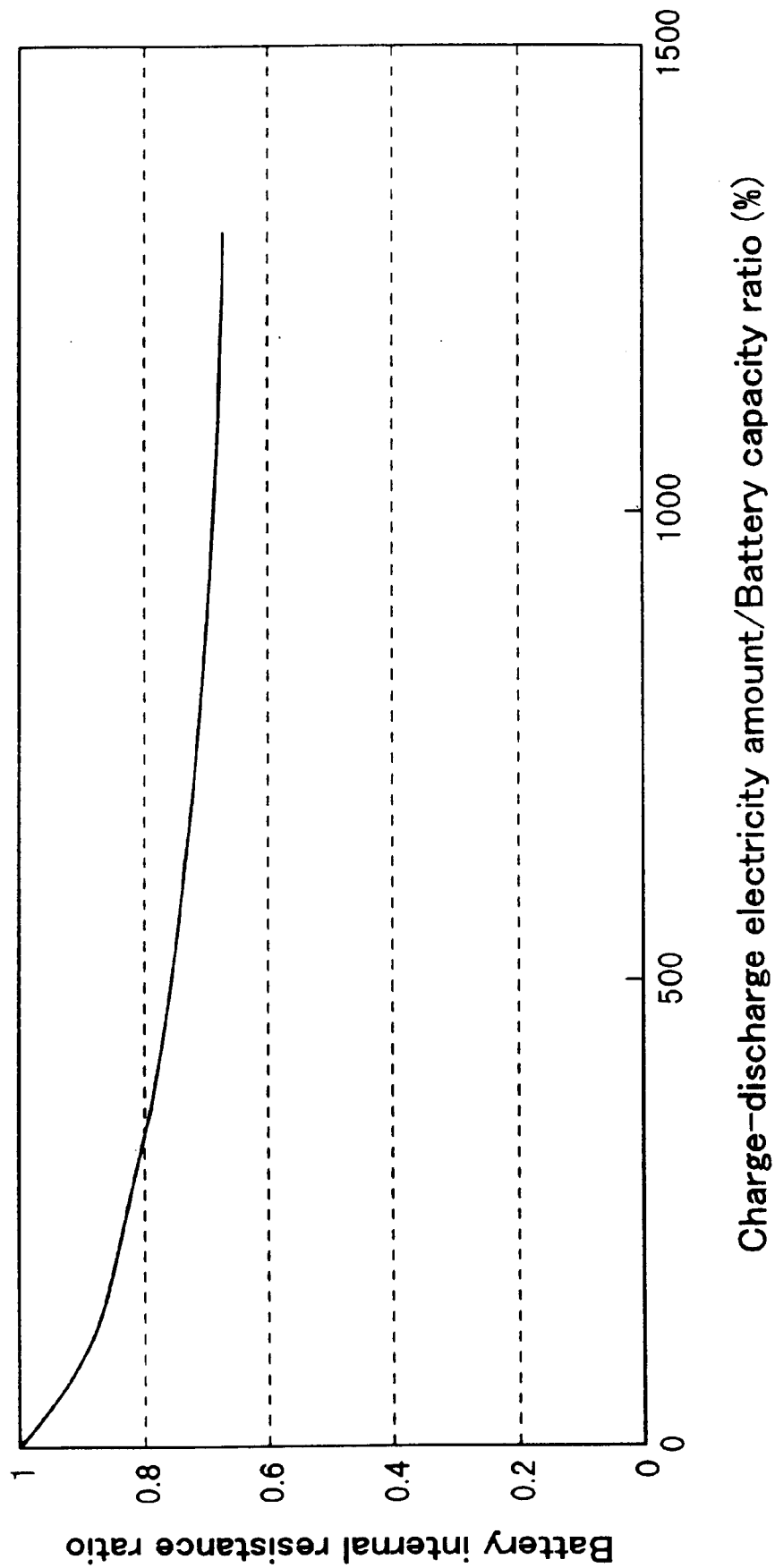
FIG. 6 is a graph to show a change of battery internal resistance when a cyclic charge-discharge is carried out for a replacement battery.
Figure 7:
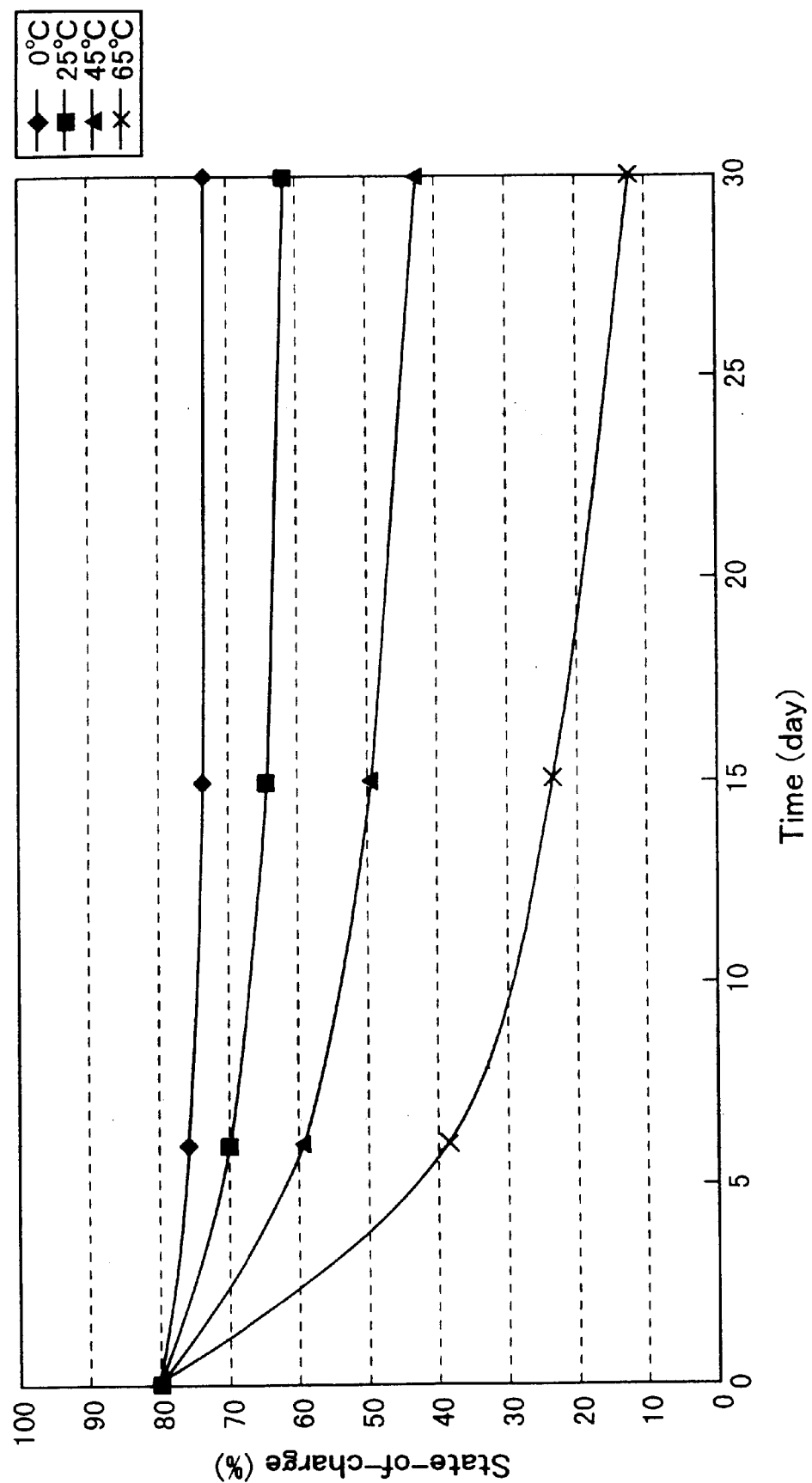
FIG. 7 is a graph to show a state-of-charge versus storage period (day) by using a temperature as a parameter with regard to a replacement battery.

FIG. 4 is a flow chart to show a routine to rebuild a battery to be replaced according to one embodiment of the present invention.

In FIG. 4, first, it is judged whether a variation range (CV) in a charge amount of a battery module to be replaced exceeds, for example 2.0 Ah (about 20% of a full charge amount) (S40). When the variation range in a charge amount (CV) is 2.0 Ah or less (No), uniform charge is carried out (S41) since the battery module may be reused. When the variation range in the charge amount (CV) exceeds 2.0 Ah (Yes) as a result of judgment at the step S40, the battery module is judged as an abnormal module (S51) and treated in a certain manner for waste-disposal or the like since it may not be reused.

Following the uniform charge in the next step S41, the full charge capacity (FC) of the battery module to be replaced is measured to judge (S42) whether the measured full charge capacity FC attains, for example, 6.5 Ah representing a specification of a new battery. If the full battery capacity is 6.5 Ah or more (No), a predetermined charge (e.g., 50%) is carried out since the battery can be reused (S43). When the full battery capacity FC is lower than 6.5 Ah (Yes) as a result of the judgment in the step S42, the battery module is judged as an abnormal module (S51) and disposed of in a certain manner as waste or the like, since it may not be reused.

Furthermore, a predetermined charge (e.g., 50%) is carried out in the next step S43, and then, the battery is left (S44) for a predetermined period (for example, from several weeks to two months). Later, it is judged whether the self-discharge amount variation range (SDV) exceeds e.g., 0.5 AH corresponding to a practical capacity of a new battery (S45). When the self-discharge amount variation range SDV is 0.5 Ah or less (No), the battery module is replaced for an abnormal module (S46) to compose a battery pack (S47), and a second uniform charge is carried out (S48). When the self-discharge amount variation range SDV exceeds 0.5 Ah (Yes), the battery module to be replaced is judged as an abnormal module (S51) and treated in a certain manner for waste-disposal or the like since it cannot be reused.

Finally, the internal resistance (IR) for every module of the battery pack is measured in a final inspection in order to judge whether the internal resistance (IR) of the module unit exceeds, for example 20 mΩ (S49). If the internal resistance exceeds 20 mΩ (Yes), the battery pack is judged as defective (S52) so that the pack will not be shipped. When the internal resistance (IR) of the module unit is 20 mΩ or less (No) as a result of the judgement in the step S49, the battery pack is judged as corresponding to a new product and shipped (S50).

As mentioned above, a battery module to be replaced is checked in the charge amount variation range and the self-discharge amount variation range after being left for a predetermined period from, e.g., several weeks to two months. If the characteristic values are within a predetermined range, the battery module to be replaced will not be disposed of but reused after being treated in a certain manner. Accordingly, the battery module is replaced not with a new replacement battery module, but with another battery module that is corresponding to a substantially new product. Otherwise, a battery pack combined with a battery module to be replaced corresponding to a new product is shipped for replacement. Accordingly, the cost will be limited to a small numbers of battery modules and the cost of inspection and rebuilding. This can decrease the cost for replacement battery packs. Moreover, waste can be reduced considerably since most of the battery modules, module holders and pack cases are reused.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A method of replacing a portion of a plurality of secondary batteries in which a defect is detected, with one or more replacement battery with respect to a battery assembly composed of the plurality of secondary batteries electrically connected either in series or in parallel, the method comprising detecting each voltage of a predetermined voltage detection block for the secondary batteries composing the battery assembly in order to judge a defect of the secondary batteries in the voltage detection block unit; and replacing a battery judged as defective with the replacement battery in the voltage detection block unit.

2. The method according to claim 1, wherein the replacement battery is a secondary battery of a maximum capacity ranking among a battery group composing the battery assembly.

3. The method according to claim 1, wherein the secondary batteries composing the battery assembly are nickel-metal hydride batteries.

4. The method according to claim 1, wherein secondary batteries to be replaced by replacement batteries include both a battery detected as defective and batteries positioned in the vicinity of the defective battery and composing the battery assembly.

5. The method according to claim 4, wherein an ambient temperature of the battery to be replaced is detected to judge whether secondary batteries positioned in the vicinity of the defective battery to be replaced are also subjected to replacement.

6. The method according to claim 1, wherein an activated secondary battery is used for the replacement battery.

7. The method according to claim 6, wherein cyclic charge-discharge is carried out to activate the replacement secondary battery.

8. The method according to claim 7, wherein the total charge-discharge amount in a charge-discharge cycle conducted to activate the replacement secondary battery is at least 450% of the battery capacity.

9. The method according to claim 6, wherein the replacement secondary battery is activated by being left for at least five days at a battery temperature of at least 50° C.

10. The method according to claim 1, wherein the replacement battery is stored at low temperature before use.

11. The method according to claim 1, wherein after the replacing of a battery judged as defective is complete, the battery assembly is charged to have at least 100% of the battery capacity for a subsequent use.

12. The method according to claim 1, wherein the secondary batteries are judged as defective based on a charge amount variation of the battery to be replaced and also based on a self-discharge amount variation after storing the battery in the battery assembly for predetermined period.

* * * * *